(12) United States Patent
Matsuura

(10) Patent No.: US 6,228,778 B1
(45) Date of Patent: May 8, 2001

(54) SEMICONDUCTOR DEVICE HAVING IMPROVED INSULATION FILM AND MANUFACTURING METHOD THEREOF

(75) Inventor: Masazumi Matsuura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/372,590

(22) Filed: Aug. 12, 1999

Related U.S. Application Data

(62) Division of application No. 09/034,997, filed on Mar. 5, 1998, now Pat. No. 6,034,418.

(30) Foreign Application Priority Data

Sep. 5, 1997 (JP) .................................................. 9-240617

(51) Int. Cl.[7] .................................................. H01L 21/31
(52) U.S. Cl. .................................................. 438/761; 438/758
(58) Field of Search .................................................. 438/645, 669, 438/782, 761

(56) References Cited

U.S. PATENT DOCUMENTS

| | | |
|---|---|---|
| 5,521,424 | 5/1996 | Ueno et al. . |
| 5,698,901 | 12/1997 | Endo . |
| 5,703,404 | 12/1997 | Matsuura . |
| 5,935,649 | * 8/1999 | Koizumi et al. .................. 427/255.3 |
| 5,976,973 | * 11/1999 | Ohira et al. .......................... 438/645 |

FOREIGN PATENT DOCUMENTS

| | | |
|---|---|---|
| 7-254592 | 10/1995 | (JP) . |
| 8-213386 | 8/1996 | (JP) . |
| 8-330293 | 12/1996 | (JP) . |
| 9-69518 | 3/1997 | (JP) . |

OTHER PUBLICATIONS

N. Hayasaka et al., "Fluorine Doped $SiO_2$ for Low Dielectric Constant Films in Sub–Half Micron ULSI Multilevel Interconnection", Extended Abstracts of the 1995 International Conference on Solid State Devices and Materials, 1995, pp. 157–159.

M. Hayashi et al., "High Density Plasma CVD Fluoro–Silicate Glass Gap–Filling for Sub–Half Micron CMOS Devices", DUMIC Conference, Feb. 1997, pp. 205–212.

T. Fukuda et al., "Highly Reliable SiOF Film Formation Using High Density Plasma Containing Hydrogen", DUMIC Conference, 1997, pp. 41–48.

* cited by examiner

*Primary Examiner*—Carl Whitehead, Jr.
*Assistant Examiner*—Jeff Vockrodt
(74) *Attorney, Agent, or Firm*—McDermott, Will & Emery

(57) ABSTRACT

A semiconductor device which has an interlayer insulating film comprised of molecules with silicon-oxygen bonds and silicon-fluorine bonds and contains a rare gas in concentration higher than $10^{11}$ atoms per $cm^2$. The interlayer insulating film is preferably a fluorine-containing silicon oxide film which contains a rare gas. In a manufacturing process, an interlayer insulating is formed by a chemical vapor deposition from a material gas including a silicon-containing gas, a fluorine compound gas, a rare gas, and oxygen. The silicon-containing gas is preferably $SiH_4$ gas, and the fluorine compound gas is preferably $SiF_4$ gas. The flow rate of the rare gas is greater than three times the total flow rate of the $SiH_4$ gas and $SiF_4$ gas. The rare gas is at least one type of gas selected from neon (Ne), argon (Ar), krypton (Kr), and xenon (Xe).

4 Claims, 8 Drawing Sheets

Fig. 3

| Condition | SiH$_4$ flow rate (sccm) | SiF$_4$ flow rate (sccm) | Ar flow rate (sccm) | O$_2$ flow rate (sccm) | Source power (W) | Substrate bias power (W) |
|---|---|---|---|---|---|---|
| Condition(a) | 30 | 70 | 450 | 150 | 4000 | 2000 |
| Condition(b) | 30 | 70 | 0 | 150 | 4000 | 2000 |
| Condition(c) | 50 | 30 | 50 | 100 | 3500 | 2500 |

SEMICONDUCTOR DEVICE HAVING IMPROVED INSULATION FILM AND MANUFACTURING METHOD THEREOF

This application is a divisional of application Ser. No. 09/034,997 filed Mar. 5, 1998 now U.S. Pat. No. 6,034,418.

BACKGROUND OF THE INVENTION

1. Field of the Invention

The present invention relates to a semiconductor device and a process for manufacturing the same. More particularly, the present invention relates to a semiconductor device having an improved interlayer insulating film and a process for manufacturing the same.

2. Background Art

The recent finer patterning of semiconductor devices has posed a serious problem with lead line delay due to the capacitance of the interlayer insulating film. Reducing the capacitance of the interlayer insulating film is an important future subject. This is true particularly in the case of lead lines finer than 0.3 m. Thus, there is a demand for a new interlayer insulating film which has a low dielectric constant and good burying properties and surface leveling properties.

It is expected that this demand will be satisfied by fluorine-containing silicon oxide film (referred to as SiOF film hereinafter). See "High density plasma CVD fluorosilicate glass gap-filling for sub-half micron CMOS devices" (Proceedings of VMIC Conference 1997).

The SiOF film has a decreased dielectric constant on account of the introduction of Si-F bonds into a silicon oxide film. For example, a silicon oxide film (free of Si-F bonds) decreases in dielectric constant from 4.4 to 3.5 when it contains about 10% fluorine.

The decrease in dielectric constant is probably due to the presence of Si-F bonds in the film in such a way that the Si-O network is partly broken and minute voids (or defects) are formed in the film. Such minute voids are three-membered rings as shown in FIG. 7($a$) or four-membered rings as shown in FIG. 7($b$). And such minute voids lead to a decrease in film density.

These minute voids (defects) present a new problem of deteriorating the resistance of the film to moisture absorption. In other words, introducing fluorine atoms into the film to lower its dielectric constant increases the minute defects due to three- or four-membered rings, thereby permitting the easy infiltration of moisture into the film from the atmosphere. The result is that the film changes into one which contains a large amount of moisture. Such a moisture-rich film has a dielectric constant as high as about 4.0. In addition, it causes imperfect contact at via holes due to gas (mainly water vapor) escaping from it in the subsequent process as shown in FIG. 8. (This is referred to as poisoned via failure). FIG. 8 shows a structure which is composed of a silicon substrate 101, an aluminum interconnection 102, a fluorine-containing silicon oxide film 103 (of conventional type), a titanium nitride film 105, and a tungsten film 106. It is to be noted that voids are formed in the fluorine-containing silicon oxide film 103 and moisture 107 migrates from them to cause contact failure.

SUMMARY OF THE INVENTION

The present invention was proposed to address the above-mentioned problems involved in the prior art technology. Therefore, it is an object of the present invention to provide a silicon oxide insulting film which is incorporated with fluorine atoms to lower its dielectric constant without adverse effect on its resistance to moisture absorption. It is another object of the present invention to provide a process for manufacturing such an insulating film.

According to one aspect of the present invention, a semiconductor device has an interlayer insulating film which is comprised of molecules with silicon-oxygen bonds and silicon-fluorine bonds and contains a rare gas in concentration higher than $10^{11}$ atoms per $cm^2$. In other words, the interlayer insulating film contains a rare gas in concentration higher than $10^{18}$ atoms per $cm^3$.

In another aspect of the present invention, the semiconductor device has an interlayer insulating film comprised of a fluorine-containing silicon oxide film which contains a rare gas in concentration higher than $10^{11}$ atoms per $cm^2$. In other words, the fluorine-containing silicon oxide film contains a rare gas in concentration higher than $10^{18}$ atoms per $cm^3$.

In another aspect of the present invention, the rare gas included in the insulation film is at least one type of gas selected from neon (Ne), argon (Ar), krypton (Kr), and xenon (Xe).

According to another aspect of the present invention, in a process for manufacturing a semiconductor device, an interlayer insulating film is formed which is comprised of molecules with silicon-oxygen bonds and silicon-fluorine bonds by a chemical vapor deposition method from a material gas including a silicon-containing gas, a fluorine compound gas, a rare gas, and oxygen such that the interlayer insulating film contains the rare gas in concentration higher than $10^{11}$ atoms per $cm^2$. In other words, the interlayer insulating film contains a rare gas in concentration higher than $10^{18}$ atoms per $cm^3$.

In another aspect of the present invention, in the process for manufacturing a semiconductor device, the interlayer insulating film is formed by a fluorine-containing silicon oxide film to contain a rare gas in concentration higher than $10^{11}$ atoms per $cm^2$. In other words, the interlayer insulating film is formed to contain a rare gas in concentration higher than $10^{18}$ atoms per $cm^3$.

In another aspect of the present invention, in the process for manufacturing a semiconductor device, the silicon-containing gas is $SiH_4$ gas and the fluorine compound gas is $SiF_4$ gas, and the total flow rate of the rare gas and oxygen is greater than three times the total flow rate of the $SiH_4$ gas and $SiF_4$ gas.

In another aspect of the present invention, in the process for manufacturing a semiconductor device, the silicon-containing gas is $SiH_4$ gas and the fluorine compound gas is $SiF_4$ gas, and the flow rate of the rare gas is greater than three times the total flow rate of the $SiH_4$ gas and the $SiF_4$ gas.

In another aspect of the present invention, in the process for manufacturing a semiconductor device, the rare gas is at least one type of gas selected from neon (Ne), argon (Ar), krypton (Kr), and xenon (Xe).

Other and further objects, features and advantages of the invention will appear more fully from the following description.

BRIEF DESCRIPTION OF THE DRAWINGS

FIG. 3 shows three typical conditions for film formation in the present invention.

BEST MODE OF CARRYING OUT THE INVENTION

Figure 1A:
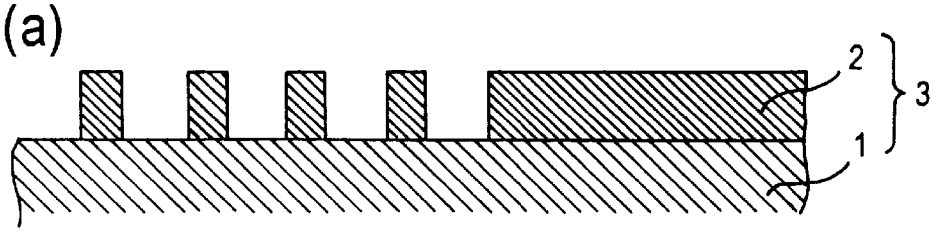
FIGS. 1($a$)–1($c$) show a process of manufacturing an interlayer insulating film according to the present invention.

Preferred embodiments of the invention will now be described with reference to the accompanying drawings in which like reference characters designate like or corresponding parts.

FIG. 1 shows a process for forming an interlayer insulating film according to one embodiment of the present invention.

The process starts with preparing a silicon substrate 1 on which are formed elements and insulating layers (not shown), as shown in FIG. 1(a). On this substrate 1 is formed an aluminum interconnection 2 of a desired pattern. In this way a wafer 3 is obtained in the first step.

Figure 1B:
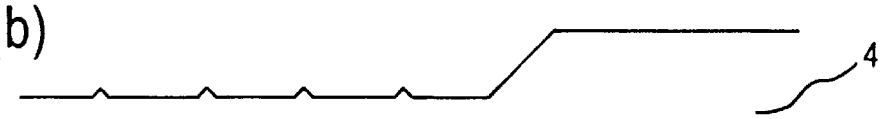
Figure 1B:
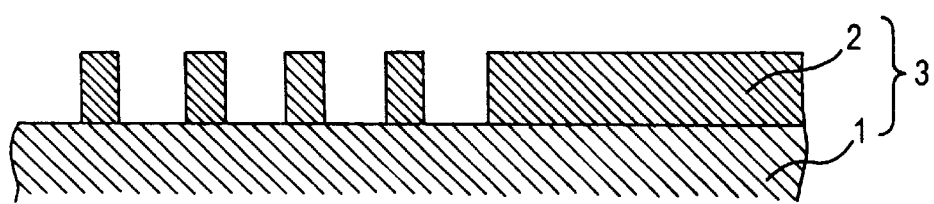

In the second step, the wafer 3 is covered with an interlayer insulating film 4 of SiOF by the high-density plasma chemical vapor deposition method (CVD), as shown in FIG. 1(b). A detailed description of this method is given later.

Figure 1C:
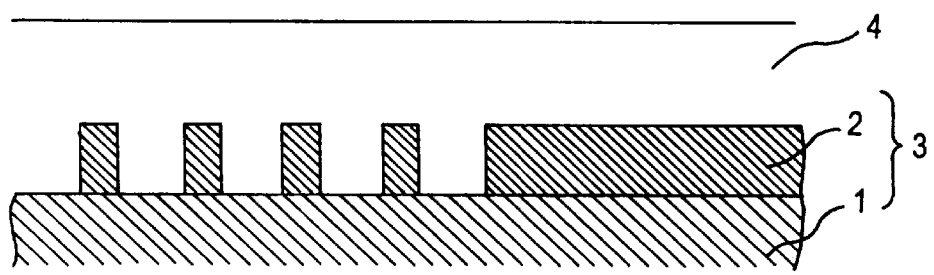

In the third step, the SiOF film 4 formed by the high-density plasma CVD method is made flat by the chemical mechanical polishing method (CMP), as shown in FIG. 1(c).

This step is usually followed by formation of connecting holes in the SiOF film 4 and formation of upper layer interconnections thereon for fabrication of semiconductor devices. These steps are carried out in the usual way and hence their explanation is omitted herein.

Figure 2:
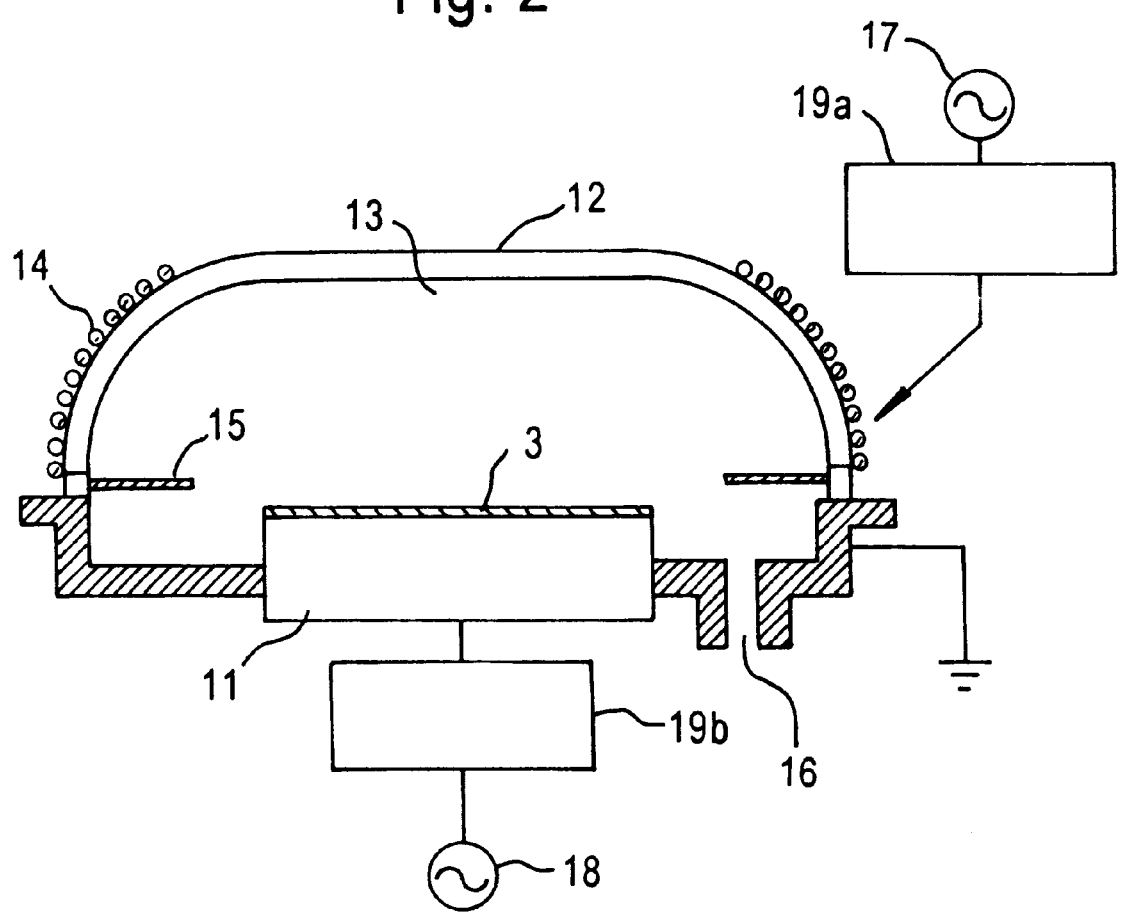
FIG. 2 shows an apparatus for chemical vapor deposition of an insulating film.

In this embodiment, the SiOF film 4 is formed by the high-density plasma CVD method as explained below. This method employs the CVD apparatus (of inductive coupling type) which has a reaction chamber 13 as schematically shown in FIG. 2. The reaction chamber 13 is enclosed by a ceramic dome 12 in which is a substrate holder 11 to hold the silicon wafer 3. The ceramic dome 12 is surrounded by a coil electrode 14 which, on application of high-frequency voltage, generates a plasma in the reaction chamber 13. The reaction chamber 13 is provided with a nozzle 15 through which the reaction gas is supplied, and an exhaust port 16 which is connected to a vacuum pump (not shown). There are shown a high-frequency source 17 and a matching circuit 19a for applying high-frequency voltage to the coil electrode 14. There are also shown a high-frequency source 18 and a matching circuit 19b for applying bias high-frequency voltage to the substrate holder 11.

Using the apparatus mentioned above, the SiOF film is formed from a mixture of silicon-containing gas, fluorine compound gas, rare gas, and oxygen.

An example of the silicon-containing gas is $SiH_4$ gas, an example of the flourine compound gas is $SiF_4$ gas, and an example of the rare gas is argon (Ar). As mentioned later, a key factor in this embodiment is to supply the rare gas at a sufficiently high flow rate so that the resulting film contains the rare gas in high concentration.

It was found that the SiOF film formed by the above-mentioned apparatus and method greatly varies in film structure depending on the operating conditions used. FIG. 3 shows three typical conditions for film formation.

Figure 4:
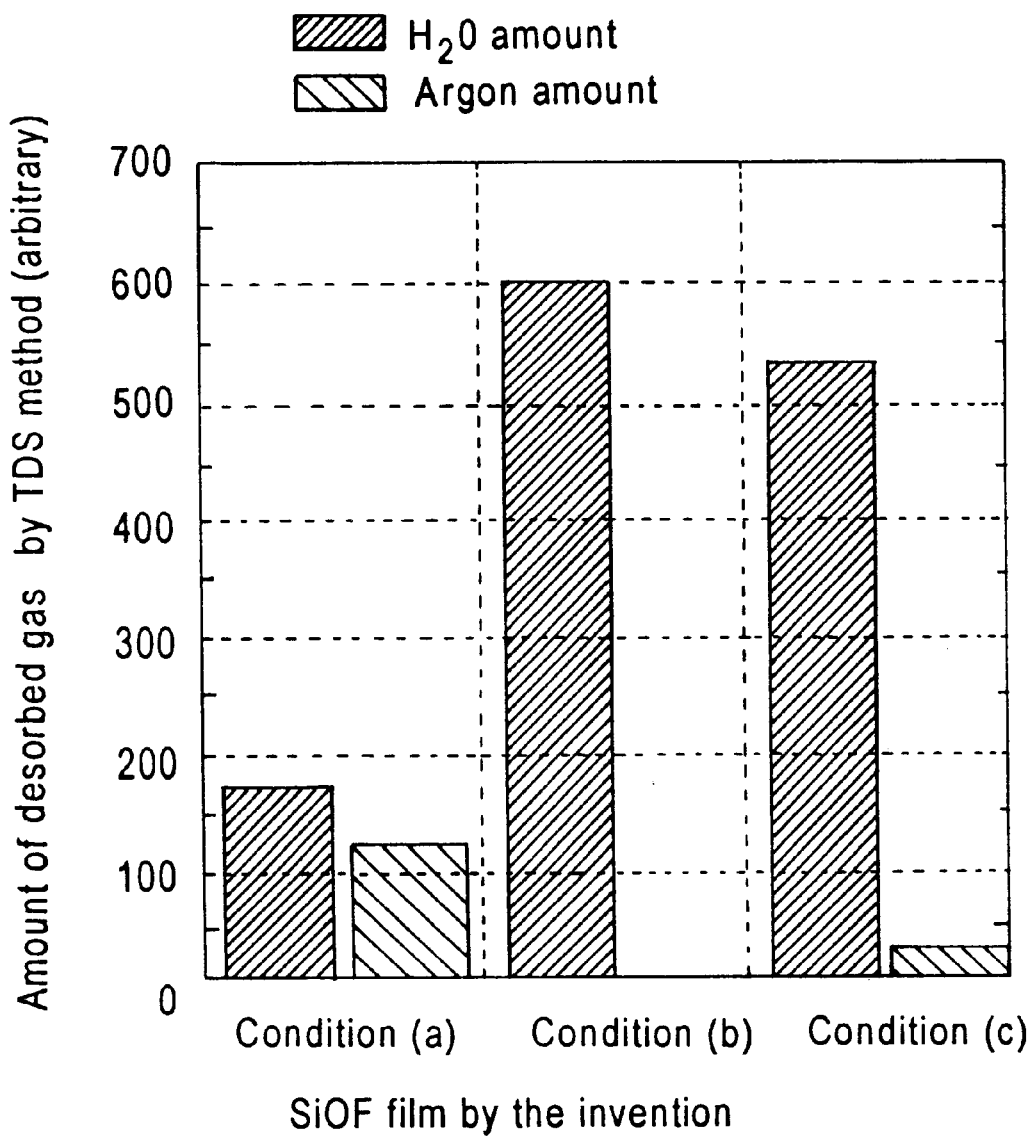
FIG. 4 is a result of analysis of insulation films by a thermal desorption spectroscopy (TDS method).

The SiOF film varies in gas desorption characteristics depending on the conditions under which it is formed. This is illustrated in FIG. 4 which is the result of analysis by the thermal desorption spectroscopy (TDS method). It is apparent from FIG. 4 that the amount of water desorbed is much smaller in the case of the condition (a) than in the case of the conditions (b) and (c), and the amount of argon desorbed is much larger in the case of the condition (a) than in the case of the conditions (b) and (c). This result suggests that the amount of water desorbed greatly decreases if the SiOF film contains argon.

Figure 5:
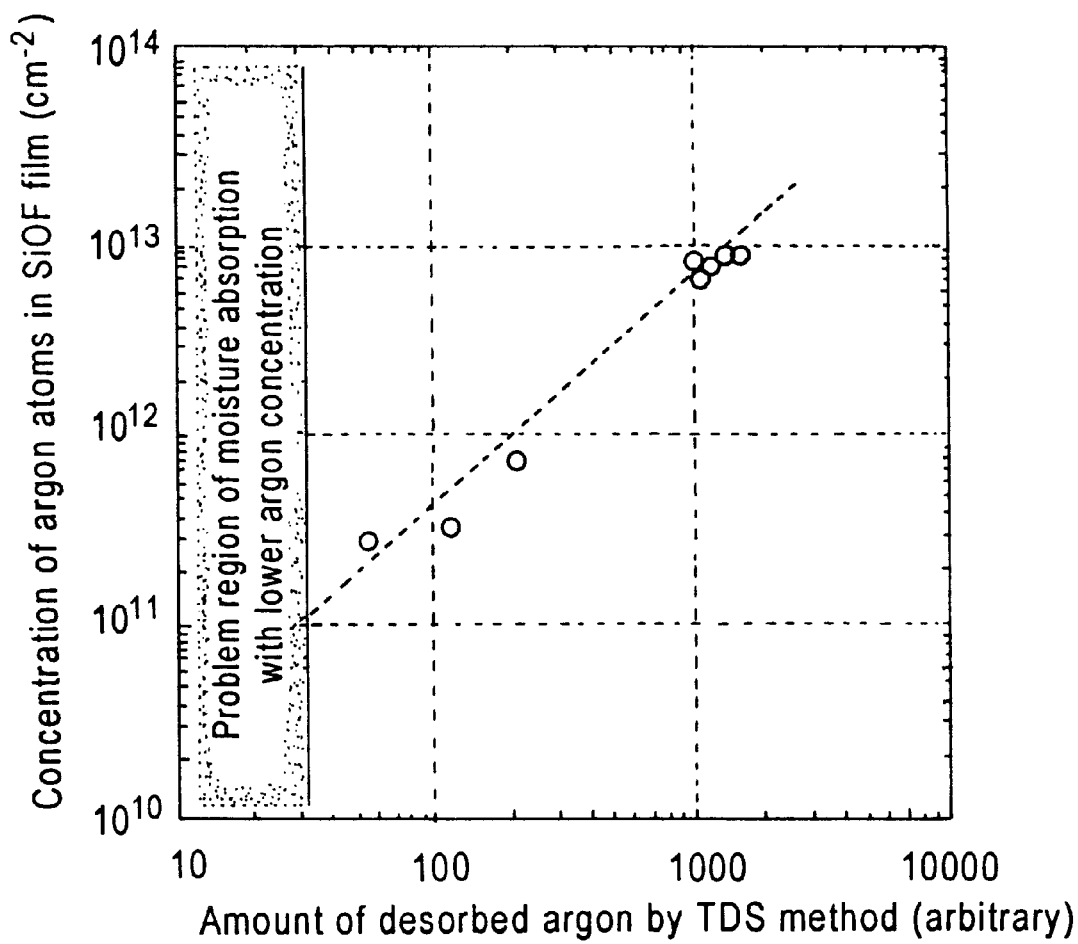
FIG. 5 shows a relation between the amount of argon desorbed and the concentration of argon atoms contained in the SiOF film.

Several SiOF films formed under varied conditions were tested for desorption of argon gas by the TDS method. FIG. 5 shows the relation between the amount of argon desorbed and the concentration of argon atoms contained in the SiOF film. There is a proportional relation between them. In this experiment, the concentration of argon atoms in the SiOF film was determined by total reflection fluorescent X-ray analysis.

FIG. 5 suggests that the SiOF film poses a problem with moisture absorption when it contains argon in concentration lower than $10^{11}$ atoms per $cm^2$. Such a concentration corresponds to the amount of argon desorbed greater than 20 (in arbitrary units) measured by the TDS method.

It was found that the SiOF film is greatly improved in moisture absorption when the amount of argon desorbed is larger than 20 (measured by the TDS method) and the concentration of argon in it is higher than $10^{11}$ atoms per $cm^2$.

The SiOF film formed under the condition (a) in FIG. 3 gives a value of 120 for the amount of argon desorbed, as shown in FIG. 5, which corresponds to a concentration of about $6 \times 10^{11}$ argon atoms per $cm^2$ in the SiOF film. By contrast, the SiOF films formed under the conditions (b) and (c) in FIG. 3 give a small value for the amount of argon desorbed, which means that the concentration of argon in them is extremely low.

In other words, the condition (a) permits the desirable SiOF film to be formed according to the present invention, whereas the conditions (b) and (c) merely afford SiOF films of conventional type.

In the above-mentioned experiment, the concentration of argon in the SiOF film is determined in terms of atoms per unit area. A concentration of $10^{11}$ atoms per $cm^2$ translates into a concentration of $10^{18}$ atoms per $cm^3$.

Conditions necessary for the SiOF film to contain more than $10^{11}$ atoms per $cm^2$ were experimentally studied. It was concluded that the object is achieved when the condition satisfies the following equations.

$$\text{(Ar flow rate} + O_2 \text{ flow rate)} \text{ (SiH}_4 \text{ flow rate} + \text{SiF}_4 \text{ flow rate)} \times 3 \quad (1)$$

or $$\text{Ar flow rate (SiH}_4 \text{ flow rate} + \text{SiF}_4 \text{ flow rate)} \times 3 \quad (2)$$

The condition (a) in FIG. 3 satisfies the equations (1) and (2) because:

Ar flow rate=450 (sccm)

Ar flow rate+$O_2$ flow rate=600 (sccm)

($SiH_4$ flow rate+$SiF_4$ flow rate)×3=300 (sccm)

However, the condition (b) in FIG. 3 does not satisfy the equations (1) and (2) because:

Ar flow rate=0 (sccm)
Ar flow rate+$O_2$ flow rate=150 (sccm)
($SiH_4$ flow rate+$SiF_4$ flow rate)×3=300 (sccm)

In addition, the condition (c) in FIG. 3 does not satisfy the equations (1) and (2) because:

Ar flow rate=50 (sccm)
Ar flow rate+$O_2$ flow rate=150 (sccm)
($SiH_4$ flow rate+$SiF_4$ flow rate)×3=240 (sccm)

Figure 6A:
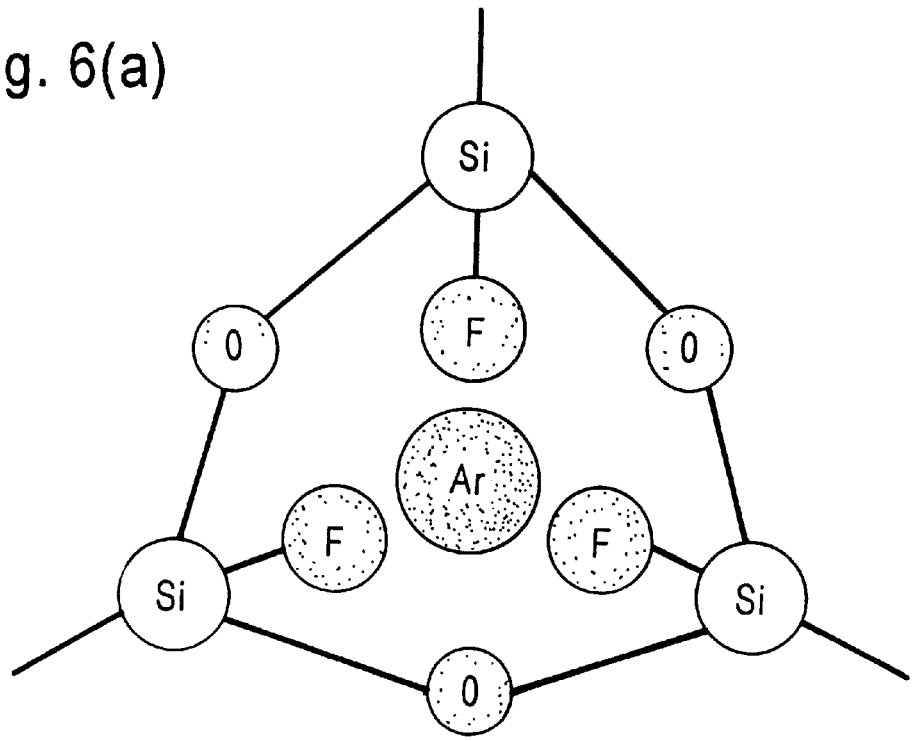
FIGS. 6(a) and 6(b) show an argon atom or argon ion contained in three- or four-membered rings.
Figure 6B:
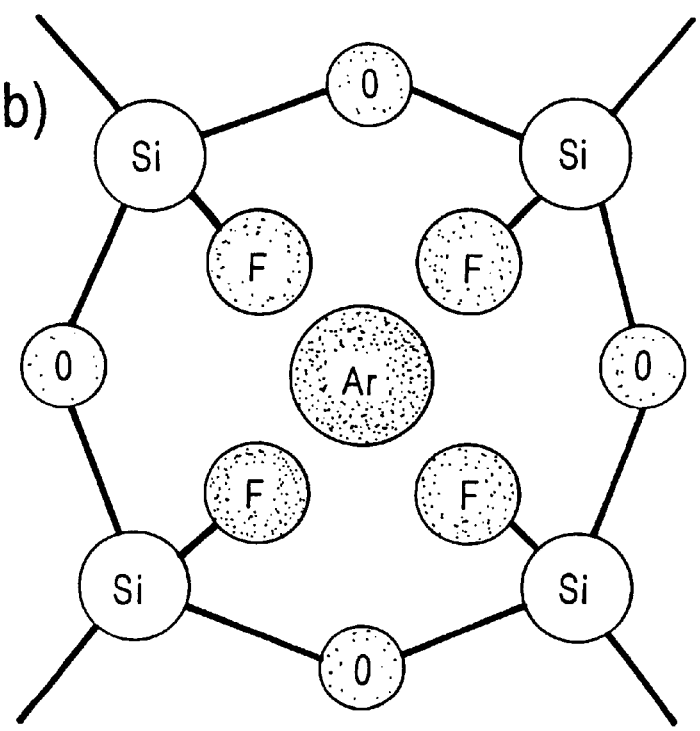
Figure 7A:
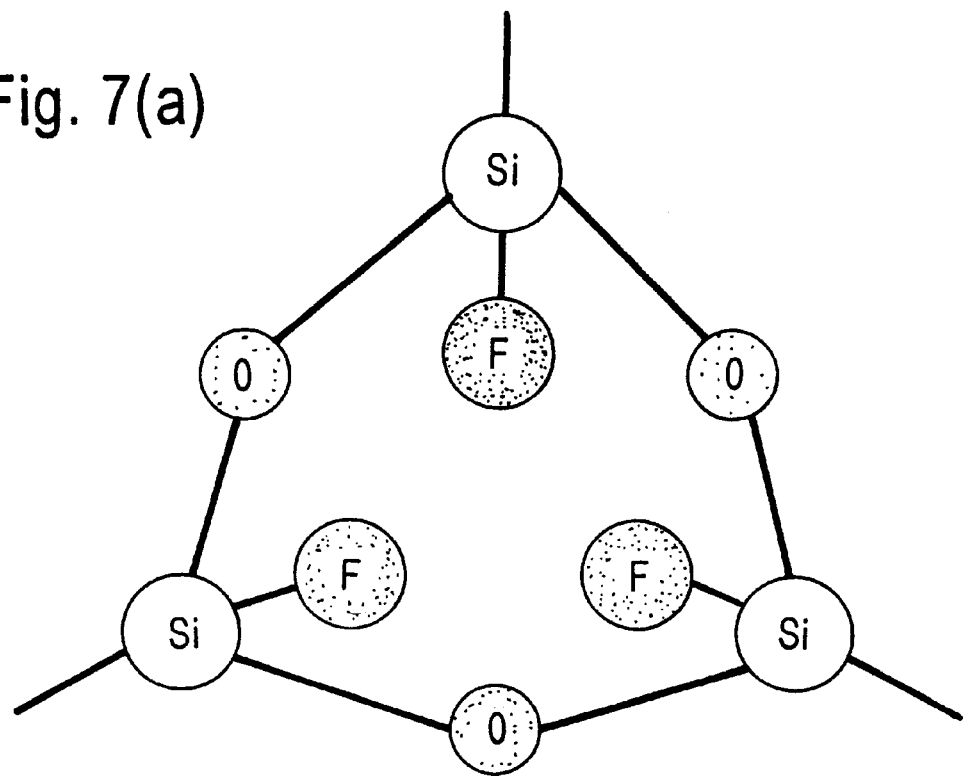
FIGS. 7(a) and 7(b) show a mixture void in three-membered rings or four-membered rings.
Figure 7B:
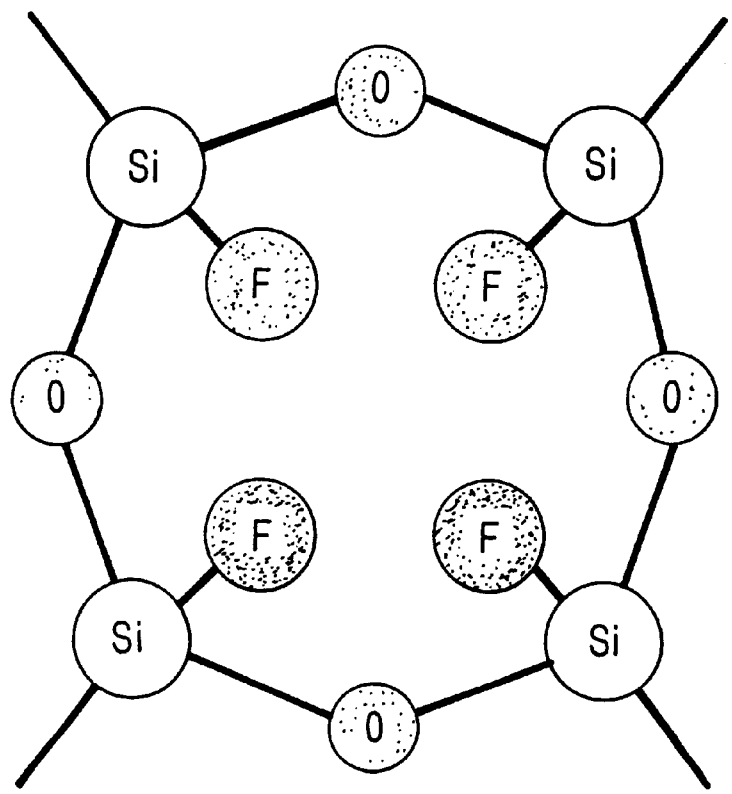
Figure 8:
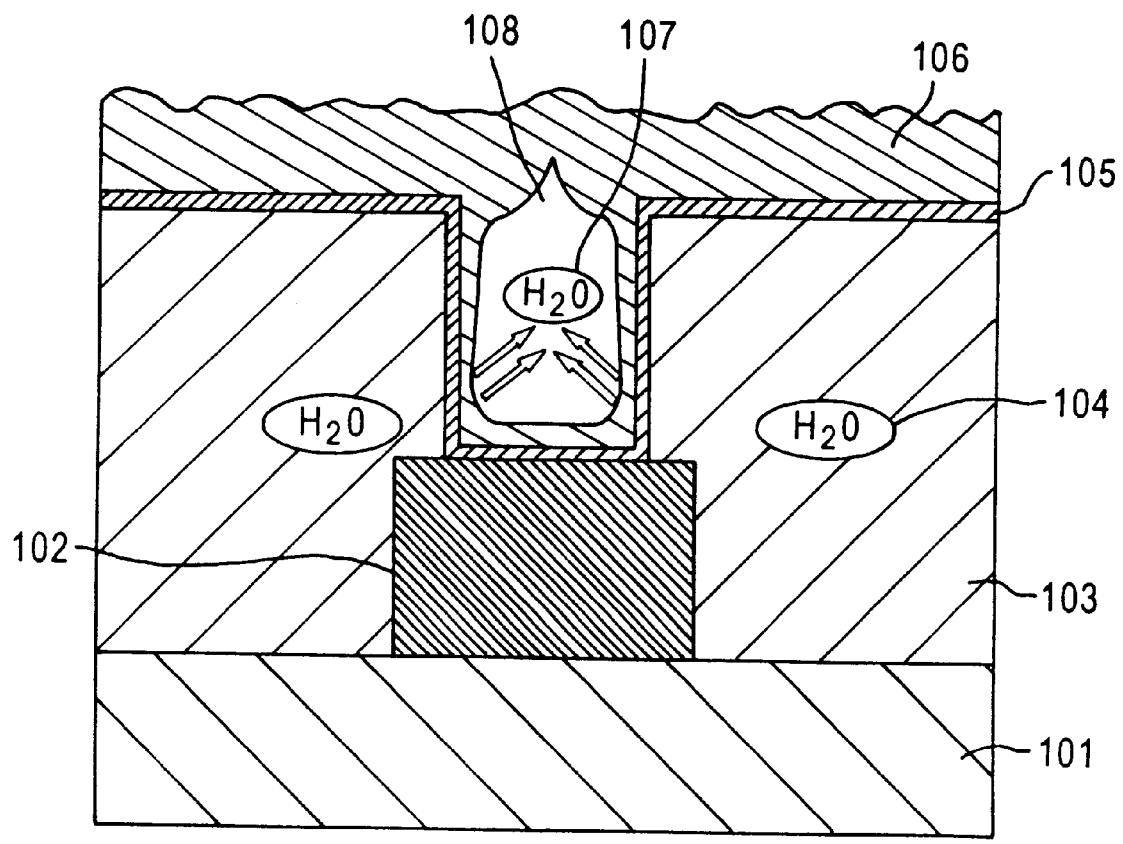
FIG. 8 shows a conventional structure including a fluorine-containing silicon oxide film.

The above results lead to the following conclusion. According to the prior art technology, the SiOF film has voids therein due to three- or four-membered rings, as shown in FIG. 7, and these voids permit moisture in the atmosphere to easily infiltrate into the film. As the result, the film contains a large amount of water, resulting in poisoned via failures, as shown in FIG. 8, which greatly aggravates the reliability of devices. By contrast, according to the present invention, the voids due to three- or four-membered rings as shown in FIG. 6, which occur in the course of film formation, are filled by argon atoms or argon ions which are contained in concentration higher than $10^{11}$ atoms per $cm^2$. This mechanism prevents the infiltration of moisture from the atmosphere, thereby suppressing poisoned via failures. Thus the present invention produces its marked functions and effects.

The above-mentioned embodiment employs argon as the rare gas. However, it is also possible to use neon (Ne), krypton (Kr), or xenon (Xe) individually or in combination in place of argon to produce the same effect.

The effects and advantages of the present invention are as follows. The present invention provides a semiconductor device having an interlayer insulating film which is composed of molecules with silicon-oxygen bonds and silicon-fluorine bonds and contains a rare gas in concentration higher than $10^{11}$ atoms per $cm^2$ or $10^{18}$ atoms per $cm^3$. The interlayer insulating film has a low dielectric constant and good moisture absorption resistance. In particular, the interlayer insulating film is a fluorine-containing silicon oxide film.

Obviously many modifications and variations of the present invention are possible in the light of the above teachings. It is therefore to be understood that within the scope of the appended claims the invention may by practiced otherwise than as specifically described.

What is claimed is:

1. A process for manufacturing a semiconductor device, said process including a step of forming an interlayer insulating film comprised of molecules with silicon-oxygen bonds and silicon-fluorine bonds by a chemical vapor deposition method from a material gas including $SiH_4$, $SiF_4$, a rare gas, and oxygen, the total flow rate of the rare gas being greater than three times the total flow rate of the $SiH_4$ gas and the $SiF_4$ gas, such that the interlayer insulating film contains the rare gas in concentration higher than $10^{18}$ atoms per $cm^3$.

2. The process for manufacturing a semiconductor device as defined in claim 1, wherein the interlayer insulating film is a fluorine-containing silicon oxide film which contains a rare gas in concentration higher than $10^{18}$ atoms per $cm^3$.

3. The process for manufacturing a semiconductor device as defined in claim 1, wherein the rare gas is at least one type of gas selected from neon (Ne), argon (Ar), krypton (Kr), and xenon (Xe).

4. The process of claim 1, wherein the total flow rate of the rare gas and oxygen is greater than three times the flow rate of the $SiH_4$ gas and the $SiF_4$ gas.

* * * * *